(12) United States Patent
Boettiger (10) Patent No.: US 9,945,718 B2
(45) Date of Patent: Apr. 17, 2018

(54) IMAGE SENSORS WITH MULTI-FUNCTIONAL PIXEL CLUSTERS

(71) Applicant: SEMICONDUCTOR COMPONENTS INDUSTRIES, LLC, Phoenix, AZ (US)

(72) Inventor: Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 206 days.

(21) Appl. No.: 14/591,763

(22) Filed: Jan. 7, 2015

(65) Prior Publication Data

US 2016/0195429 A1    Jul. 7, 2016

(51) Int. Cl.
| | |
|---|---|
| H01L 27/00 | (2006.01) |
| G01J 1/04 | (2006.01) |
| G01J 1/02 | (2006.01) |
| G01J 3/28 | (2006.01) |
| G01J 4/04 | (2006.01) |
| G01J 3/02 | (2006.01) |
| G01J 1/42 | (2006.01) |
| H04N 5/369 | (2011.01) |
| H04N 9/04 | (2006.01) |
| G01J 1/44 | (2006.01) |

(52) U.S. Cl.
CPC ........... *G01J 1/0488* (2013.01); *G01J 1/0209* (2013.01); *G01J 1/0411* (2013.01); *G01J 1/4228* (2013.01); *G01J 3/0208* (2013.01); *G01J 3/0259* (2013.01); *G01J 3/2803* (2013.01); *G01J 4/04* (2013.01); *H04N 5/3696* (2013.01); *H04N 9/045* (2013.01); *G01J 2001/448* (2013.01)

(58) Field of Classification Search
CPC ...... G01J 1/44; G01J 1/0488; G01J 2001/446; G01J 1/0411; G01J 2001/448; G01J 1/0209; G01J 3/2803; G01J 4/04; G01J 3/0208; G01J 1/4228; G01J 3/0259; H04N 5/3696; H04N 9/45
USPC ...................................... 250/208.1
See application file for complete search history.

(56) References Cited

U.S. PATENT DOCUMENTS

| | | |
|---|---|---|
| 6,873,338 B2 | 3/2005 | Berstis |
| 7,808,023 B2 | 10/2010 | Yang et al. |
| 8,648,948 B2 | 2/2014 | Rafferty et al. |

(Continued)

*Primary Examiner* — Georgia Y Epps
*Assistant Examiner* — Kevin Wyatt
(74) *Attorney, Agent, or Firm* — Treyz Law Group, P.C.; Zachary D. Hadd (57) ABSTRACT

An imaging system may include several different types of pixels that are each configured to detect different characteristics of light received at the imaging system. An imaging system may include image sensing pixels that detect the wavelength and intensity of the light, direction sensing pixels that detect the directionality of the light, polarization sensing pixels that detect a polarization state of the light, and diffractive wavelength separation pixels that detect multiple different wavelength components of the light. One or more pixels of the different types may be arranged in a pixel cluster. A pixel cluster that includes different pixel types may detect spatially correlated information for multiple characteristics of the light. Multiple pixel clusters may be arranged in a pixel array that generates an image based on spatially correlated information for the different characteristics of the light.

23 Claims, 6 Drawing Sheets

(56) References Cited

U.S. PATENT DOCUMENTS

| | | | |
|---|---|---|---|
| 2007/0045513 A1* | 3/2007 | Lee | H01L 27/1464 250/208.1 |
| 2009/0200469 A1 | 8/2009 | Morin et al. | |
| 2010/0013969 A1 | 1/2010 | Ui | |
| 2010/0194901 A1* | 8/2010 | van Hoorebeke | G02B 3/0068 348/218.1 |
| 2010/0208245 A1* | 8/2010 | Leviton | G01C 21/025 356/139.02 |
| 2011/0058038 A1 | 3/2011 | Twede | |
| 2011/0292402 A1* | 12/2011 | Awatsuji | G01B 9/021 356/495 |
| 2012/0224176 A1* | 9/2012 | Hammond | G03F 7/70633 356/401 |
| 2013/0188023 A1 | 7/2013 | Kuang et al. | |
| 2014/0145068 A1 | 5/2014 | Meynants | |

* cited by examiner

IMAGE SENSORS WITH MULTI-FUNCTIONAL PIXEL CLUSTERS

BACKGROUND

This relates generally to imaging systems, and more particularly, to imaging systems having pixel arrays that include multiple pixel types.

Modern electronic devices such as cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

Some conventional imaging systems are designed to detect the intensity and wavelength of the light received at the image sensor. Such imaging systems may include image pixel arrays that have one type of pixel, such as an image sensor pixel that is configured to receive light of a certain wavelength and generate an electrical signal indicative of the intensity and/or amount of the light that is received. Conventional imaging systems may have multiple pixels configured to detect light of different wavelengths arranged in a pattern in the image pixel array, such as multiple image sensor pixels having color filters arranged in a Bayer mosaic pattern. Such image sensor pixel arrangements may be useful for generating images based on the wavelength and intensity of the light received at the image pixel array.

It may be desirable to obtain information relating to various characteristics of light that is received, by an imaging system, such as the intensity of light having wavelengths in the infrared and ultraviolet spectra, the polarization, and the direction of the light. Such information may be useful in providing a more complete characterization of the optical radiance that is received by the imaging system. For example, an imaging system that is able to provide information relating to the polarization and direction of the light that is received by the imaging system may be able to provide more detailed information relating to the time-dependent intensity distribution of light in any direction in 3D space, as well as information relating to its polarization and wavelength properties. However, conventional imaging systems that include pixel arrays having only one type of pixel configured to detect the wavelength and intensity and/or amount of light received at the pixel array provide limited or no information relating to these other types of information.

Some multi-array imaging systems include separate pixel arrays having different pixel types that are capable of detecting different characteristics of light. However, such multi-array imaging systems having multiple different pixel arrays may require increased power, more processing resources, and additional space in an electronic device than a single pixel array.

It would therefore be desirable to provide improved pixel arrays capable of detecting various different characteristics of light.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
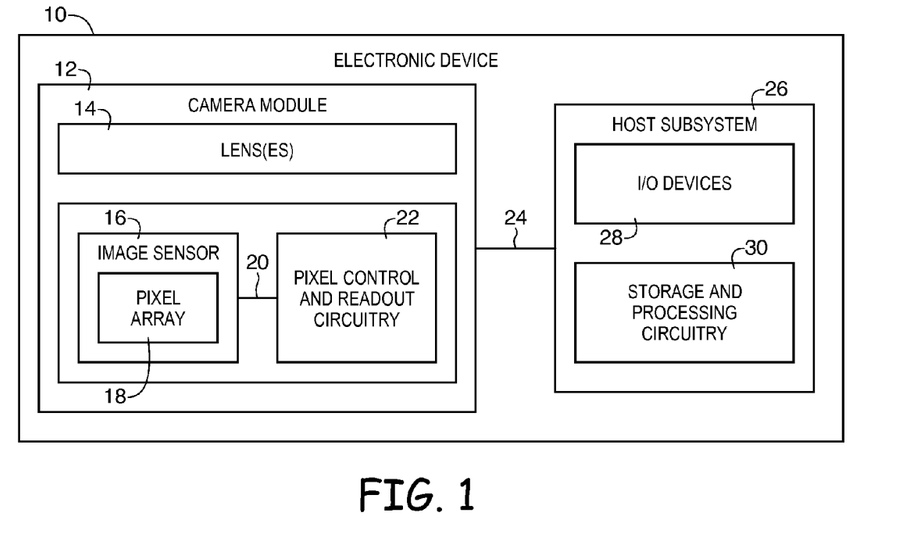
FIG. 1 is a diagram of an illustrative electronic device that may include an image sensor with a pixel array containing multiple different pixel types in accordance with an embodiment of the present invention.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data.

Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include an array of pixels such as pixel array 18 (sometimes referred to herein as array 18). If desired, camera module 12 may be provided with an array of lenses 14 and an array of corresponding image sensors 16 which may include one or more pixel arrays such as pixel array 18.

Pixels in pixel array 18 may generate image signals in response to receiving light from a scene. For example, pixels in array 18 may include photosensitive elements such as photodiodes that convert incoming light into electric charge. Image pixels in pixel array 18 may be connected to pixel control and readout circuitry 22 via path 20, which may control image sensor 16 and the pixels of pixel array 18 contained therein. Pixel control and readout circuitry 22 may include any desired pixel control and/or readout circuitry (e.g., row control circuitry, column read out circuitry, etc.). Pixel control and readout circuitry 22 may include circuitry for converting analog image signals into corresponding digital image pixel data (e.g., a respective pixel value generated by each image sensor pixel). Pixel values generated by pixel array 18 and pixel control and readout circuitry 22 may be transmitted via path 24 to components of host subsystem 26 such as input/output devices 28 and storage and processing circuitry 30.

Electronic device 10 typically provides a user with numerous high level functions. In a computer or advanced cellular telephone, for example, a user may be provided with the ability to run user applications. Components of host subsystem 26 may be configured to implement these functions. For example, electronic device 10 may have a host subsystem 26 that includes input/output devices 28 such as projectors, keypads, input-output ports, and displays. Host subsystem 26 may also include storage and processing circuitry 30. Storage and processing circuitry 30 may include volatile and nonvolatile memory (e.g., random-access memory, flash memory, hard drives, solid state drives, etc.). Storage and processing circuitry 30 may also include processors such as microprocessors, microcontrollers, digital signal processors, application specific integrated circuits, etc.

Storage and processing circuitry 30 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within camera module 12 that is associated with image sensors 16). Image data that has been captured by camera module 12 may be processed and stored using storage and processing circuitry 30 (e.g., using an image processing engine on processing circuitry 30, using an imaging mode using selection engine on processing circuitry 30, etc.). Processed image data may, if desired, be provided to external equipment (e.g., a computer, external display, or other device) using wired and/or wireless communications paths coupled to processing circuitry 30. For example, image data processed by storage and processing circuitry 30 may be displayed to a user using input/output devices 28, or may be stored on electronic device using storage circuitry included in host subsystem 26. Processed image data may be presented to a user as an image.

Pixels included in pixel array 18 may be configured to detect different characteristics of the light that is received by the pixels in pixel array 18. For example, pixel array 18 may include pixels that are configured to detect the wavelength and intensity of light (i.e., visible light) that is captured at pixel array 18 by image sensor 16. Pixel array 18 may include pixels that are configured to detect light that is outside the visible spectrum (e.g., light having a wavelength in the infrared or ultraviolet spectrum). If desired, pixel array 18 may also include pixels that are configured to detect other characteristics of light, such as the direction of the light or the polarization state of the light. Pixel array 18 may include pixels that are configured to detect different wavelengths of light with improved, quantum efficiency by collecting light onto different photosensors using diffraction gratings. Pixel array 18 may include one, two, three, or more different types of pixels. Pixel array 18 may be entirely made up of one pixel type (e.g., every pixel in pixel array 18 may be substantially the same), or pixel array 18 may be made up of more than one pixel type. If desired, the different types of pixels included in pixel array 18 may be formed in a pattern or specific arrangement. In one illustrative embodiment, different types of pixels in pixel array 18 may be grouped into pixel blocks that serve as a base unit for pixel array 18. In such an embodiment, pixel array 18 may include multiple pixel blocks that are arranged in a repeating pattern.

Figure 2:
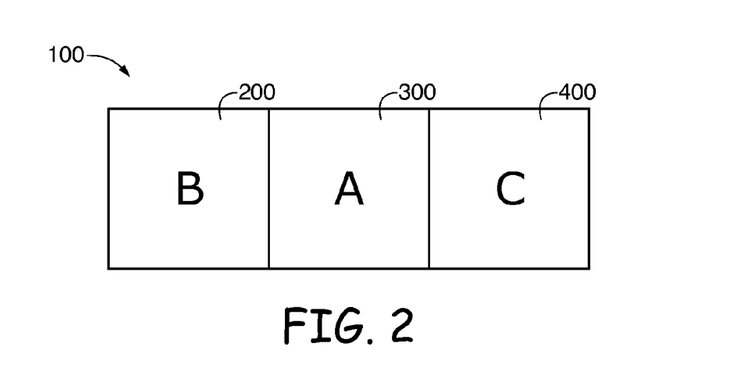
FIG. 2 is diagram of an illustrative pixel block that may include pixels of different types for detecting different properties of the light that is received by the pixels in accordance with an embodiment of the present invention.

An illustrative pixel block of the type that may be included in pixel array 18 is shown in FIG. 2. Pixel block 100 (sometimes referred to herein as block 100, pixel cluster 100, cluster 100, pixel unit 100, or unit 100) may include multiple different types of pixels. For example, pixel block 100 may include a first type of pixel 200, a second type of pixel 300, and/or a third type of pixel 400. Pixels 200, 300, and 400 may all be configured to generate different types of data relating to the light that is received upon pixel block 100. As shown in FIG. 2, each of pixels 200, 300, and 400 may include a single pixel, and pixel block 100 may include pixels 200, 300, and 400 formed in a row (e.g., pixel block 100 may be three pixels formed in a row). This, however, is merely illustrative. Pixel block 100 may be formed of any number of pixels in any suitable configuration. For example, pixel block 100 may be formed of one, two, three, four, five, six, more than six, ten, more than ten, or any other suitable number of pixels. The pixels of pixel block 100 may be formed of pixels arranged in any suitable configuration. For example, the pixels of pixel block 100 truly be formed in a row (e.g., as shown in the illustrative example of FIG. 2), or may be formed in any other suitable arrangement or pattern. The pixels of pixel block 100 may be formed in a square pattern, a rectangular pattern, a triangular pattern, a hexagonal pattern, in groupings or clusters having dimensions such as one pixel by two pixels, two pixels by three pixels, four pixels by one pixel, or any other suitable arrangement or pattern.

As shown in the illustrative example of FIG. 2, each of the pixels in a pixel block 100 may be different. This, however, is merely illustrative. Pixel block 100 may be formed of any suitable combination of pixels that are the same or that are different. For example, pixel block 100 may be formed entirely of pixels 200 that are configured to detect a characteristic of light that is received at pixel array 18. Pixels 200 in pixel block 100 may be oriented substantially similarly, or may be oriented differently within pixel block 100 in order to provide different types of information relating to the characteristic of the light that the pixels 200 are configured to detect. In one illustrative scenario, pixel block 100 may include multiple different types of pixels. For example, pixel block 100 may include both pixels 200 and pixels 300 (e.g., pixel block 100 may include two different types of pixels designed to detect two different characteristics of light). Pixel block 100 may include multiple pixels 200 and multiple pixels 300. Pixels 200 and 300 may be arranged in a specified pattern. For example, pixels 200 may be arranged on either side of pixels 300, or pixels 300 may be configured to surround a pixel 200 in pixel block 100. In one illustrative embodiment, pixels 200 and 300 may be randomly configured in pixel block 100. This, however, is merely illustrative. Pixel block 100 may include any different number of pixels such as pixels 200, 300, and 400, and the pixels of pixel block 100 may be configured in any suitable pattern or arrangement to allow for pixel block 100 to detect any suitable characteristics of the light that is received at pixel array 18.

As shown in the illustrative example of FIG. 2, each pixel such as pixel 200, pixel 300, and pixel 400 may comprise a single pixel. This, however, is merely illustrative. For example, a pixel 400 designed to detect a certain characteristic of light may include one pixel or more than one pixel. For example, pixels 200, 300 and/or 400 may include two individual pixels that are configured to detect a characteristic of light that is received at pixel array 18. In one illustrative example, pixels such as pixels 200, 300 and/or 400 may include two pixels that are each the size of one individual pixel, or may include two pixels that are each half of the size of an individual pixel. For example, the dimensions of a pixel such as pixel 200, 300 and/or 400 may be larger or smaller than other pixels in pixel array 18 or pixel block 100. This, however, is merely illustrative. Any of the pixels such as pixels 200, 300, and 400 in pixel block 100 or pixel array 18 may include any suitable number of pixels or may contain any suitable number of different pixel elements (for example, a pixel such as pixel 200, 300, or 400 may include one or more photodiodes, color filter elements, or an other elements included in a pixel), may have any suitable size, shape, or dimension, and may be relatively larger or relatively smaller than other pixels in pixel array 18 or block 100.

Figure 3:
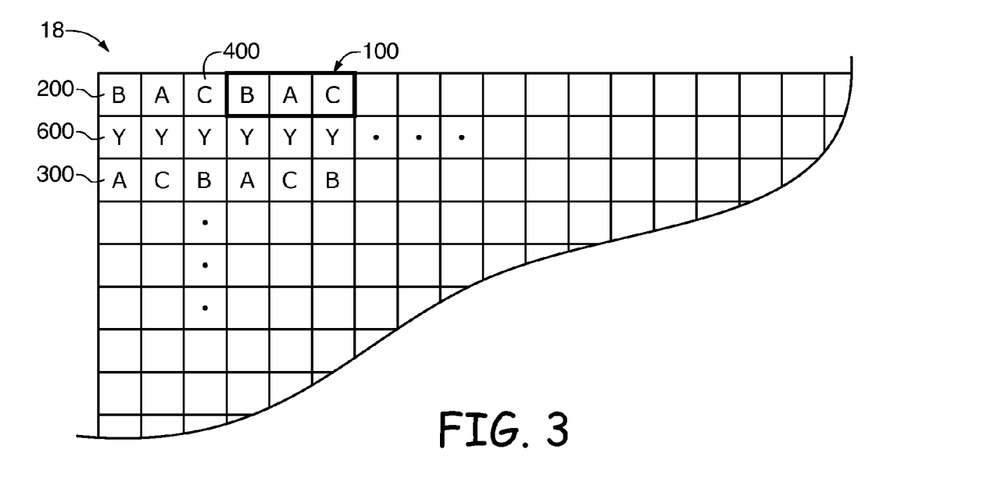
FIG. 3 is a diagram of an illustrative pixel array that may include pixel blocks such as the pixel block shown in FIG. 1 in accordance with an embodiment of the present invention.

An illustrative pixel array such as pixel array 18 that may be included in image sensor 16 of camera module 12 is shown in FIG. 3. In the illustrative embodiment of FIG. 3, pixel array 18 may include multiple different types of pixels such as pixel 200, pixel 300, and pixel 400 configured to detect different characteristics of the light that is received at pixel array 18. In the illustrative example of FIG. 3, pixels 200, 300, and 400 are formed in pixel blocks 100. Pixel array 18 may include multiple pixel blocks 100. In one illustrative example, pixel array 18 may be formed entirely of pixel blocks 100. In such an example, pixel array 18 may be formed entirely of pixel blocks 100 having the same arrangement and types of pixels, or may be formed of pixel blocks having different arrangements and types of pixels. For example, pixel array 18 may be formed of multiple different types of pixel blocks 100 arranged in any suitable configuration (e.g., alternating pixel blocks, pixel blocks formed around an edge of pixel array 18 with other pixel blocks formed in a central region of array 18, etc.). Pixel array 18 may also include combinations of pixel blocks 100 and pixels that are not included in pixel blocks 100. For example, pixel array 18 may include pixels such as pixels 600 that are not formed as a part of pixel blocks 100. Pixels 600 may include any suitable type of pixels and may be pixels that are the same as or different from pixels such as pixels 200, 300, and 400 included in pixel block 100. In one illustrative example, pixels 600 may be image sensor pixels that are configured to detect the wavelength and intensity of light.

In one illustrative example, pixels 600 may be pixels arranged in a Bayer mosaic pattern and may be formed in pixel array 18 with pixel blocks 100. For example, pixels in array 18 such as pixels 600 (or any of pixels 200, 300, and/or 400 formed in pixel block 100) may be provided with a color filter element which allows a single pixel to sample red, green, and blue (RGB) light. The Bayer mosaic pattern consists of a repeating unit cell of two-by-two image pixels, with two green image pixels diagonally opposite one another and adjacent to a red image pixel diagonally opposite to a blue image pixel. Such an array may be able to detect the wavelength and intensity of light received at pixel array 18 using pixels such as pixels 600, as well as other characteristics of the light received at pixel array 18 (using, for example, pixels formed in pixel block 100, or any other pixels in pixel array 18). This, however, is merely illustrative. Pixels 600 may be any type of pixels configured to detect any characteristics of light received at pixel array 18.

In the illustrative example of FIG. 3, pixels such as pixels 200, 300, and 400 arranged in pixel blocks 100 are arranged, in alternating rows with pixels 600. This, however, is merely illustrative. Pixel blocks 100 and pixels 600 may be arranged in any suitable configuration in pixel array 18. For example, pixel blocks 100 and pixels 600 may be arranged in alternating rows, columns, and/or patterns, or in patterns in which pixels 600 surround pixel blocks 100. In one suitable arrangement, pixel array 18 may contain no pixels other than those pixels contained, in pixel block 100 (e.g., pixel array 18 may not include pixels 600), and pixel block 100 may include image sensor pixels arranged in a Bayer mosaic pattern to detect the wavelength and intensity of light received at pixel array 18, as well as other characteristics of light received at pixel array 18 (such as polarization and direction, for example, which may be detected using pixels such as pixels 200, 300, and/or 400).

Figure 4:
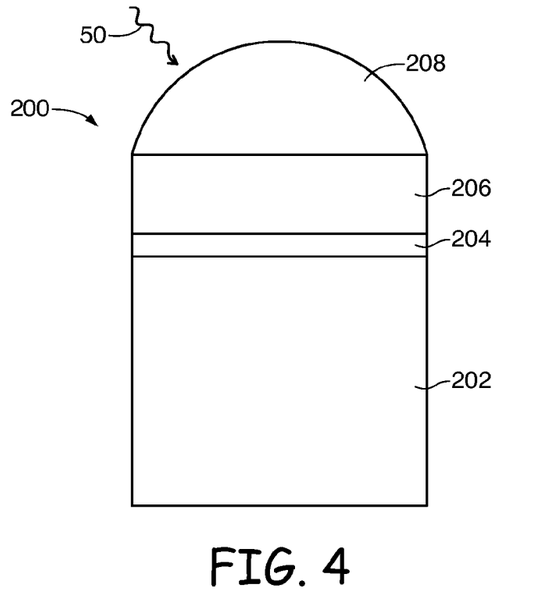
FIG. 4 is a cross-sectional view of an illustrative image sensor pixel in accordance with an embodiment of the present invention.

A cross-sectional view of an illustrative image sensing pixel 200 (sometimes referred to herein as pixel 200, image pixel 200, or image sensor pixel 200) that may be formed in a pixel block 100 (in, for example, pixel array 181 is shown in FIG. 4. As shown in FIG. 4, pixel 200 may be provided with a photosensitive portion such as photodiode 202, an antireflective coating layer such as layer 204 (sometimes referred to herein as ARC layer 204), a color filter element such as color filter element 206 (sometimes referred to herein as color filter 206 or color filter layer 206), and a lens such as lens 208 (sometime referred to herein as microlens 208). A desired color filter element 206 may be formed over an upper surface of the photodiode 202 of an associated pixel 200. A lens such as microlens 208 may be formed over an upper surface of color filter element 206 to focus incoming light such as image light 50 (sometimes referred to herein as light 50, incoming light 50, incident light 50, or photons 50) onto the photosensitive region such as photodiode 202 associated with pixel 200. Incoming light 50 may be focused onto a photosensitive region such as photodiode 202 by microlens 208 and may pass through color filter element 206 so that only light of a corresponding color is captured at photodiode 202. If desired. ARC layer 204 may be interposed between color filter element 206 and photodiode 202 for one or more pixels 200 in array 18. In another suitable arrangement, ARC layer 204 may be interposed between color filter element 206 and microlens 208 for one or more pixels 200 in array 18. ARC layer 204 may be configured to reduce the reflection of light incident upon pixel 200. In one illustrative embodiment, ARC layer 204 may be omitted from pixel 200.

All or some of pixels 200 may be provided with a color filter element 206. Color filter elements for image sensor pixels 200 may be red color filter elements (e.g., photoresistive material that passes red light while reflecting and/or absorbing other colors of light), blue color filter elements (e.g., photoresistive material that passes blue light while reflecting and/or absorbing other colors of light), green color filter elements (e.g., photoresistive material that passes green light while reflecting and/or absorbing other colors of light), clear color filter elements (e.g., transparent material that passes red, blue and green light), yellow color filter elements, or any other desired color filter elements. Color filter elements 206 may also be configured to filter light that is outside the visible human spectrum. For example, color filter elements 206 may be configured to filter ultraviolet or infrared light (e.g., color filter element 206 may only allow infrared light to reach photodiode 202). Color filler elements may therefore configure pixel 200 to only detect light of a certain wavelength (for example, light having a wavelength that corresponds to a certain visible color, or an infrared or ultraviolet wavelength). In one illustrative embodiment, pixel 200 may not include any color filter elements 206.

Pixels such as pixel 200 may provide information such as the wavelength and/or intensity of light that is received by pixel 200. For example, the signal generated by photodiode 202 in response to the light that is incident thereon may be indicative of the intensity of the light that is received at pixel 200. In one illustrative example, photodiode 202 may generate an electrical signal having a first magnitude when the light received thereon has a first intensity. When photodiode 202 receives light having a second intensity that is greater than the first intensity, photodiode 202 may generate an electrical signal having a second magnitude that is greater than the first magnitude. In this way, the signal generated by photodiode 202 may be indicative of the intensity of the light received by a pixel such as image sensing pixel 200 in pixel array 18. Color filter elements 206 may allow only light of a certain wavelength to reach photodiode 202, and may therefore cause photodiode 202 to generate an electrical signal that is indicative only of light having a certain wavelength. Other structures of image sensing pixel 200, such as lens 208, may allow image sensing pixel 200 to receive more light (at, for example, photodiode 202) by directing light that is received at lens 208 towards photodiode 202. ARC layer 204 may reduce an amount of light that is reflected from image sensing pixel 200 (e.g., ARC layer 204 may reduce surface reflections). Reducing such reflections may increase an amount of light that may be received at photodiode 202 and may reduce the presence of unwanted image artifacts in images generated by image sensor 16. These examples, however, are merely illustrative. A pixel in pixel array 18 or in pixel block 100 (such as, for example, image sensing pixel 200) may be provided with any suitable construction and may be provided with more or less additional layers or components. For example, a pixel such as image sensing pixel 200 for any other pixel in pixel array 18 or a pixel block 100) may be provided with additional layers such as a polarizer layer, a planarization layer, a diffraction grating or diffraction grating layer, multiple color filter elements, multiple lenses or microlens structures, filters for filtering light such as light 50 that is received at a pixel, light-blocking structures, opaque, partially opaque, translucent, or transparent layers or structures, or any other suitable layer or structure that may be included in, a pixel. In some illustrative examples, one or more (e.g., all) of the layers described in connection with image sensing pixel 200 (or any other pixel that may be formed in pixel array 18) may be partially or completely omitted from a pixel that is thrilled in pixel array.

Figure 5:
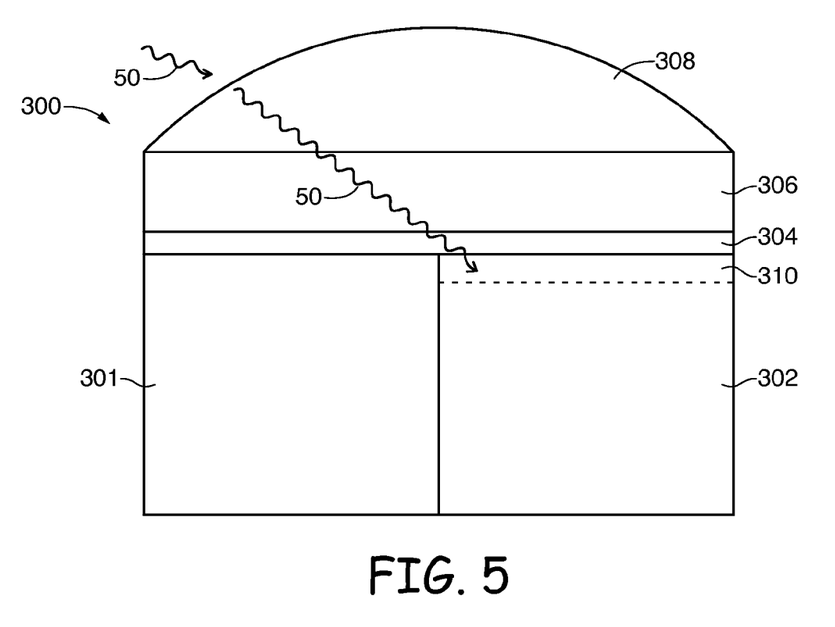
FIG. 5 is a cross-sectional view of an illustrative direction sensitive pixel in accordance with an embodiment of the present invention.

A cross-sectional view of an illustrative direction sensing pixel 300 (sometimes referred to herein as pixel 300, direction sensitive pixel 300, direction pixel 300, or phase detection pixel 300) that may be formed in as pixel block 100 (in, for example, pixel array 18) is shown in FIG. 5. In the illustrative example of FIG. 5, direction sensing pixel 300 may be provided with a first photodiode 301 (sometimes referred to herein as photodiode 301), a second photodiode 302 (sometimes referred to herein as photodiode 302), an ARC layer 304 (which may generally correspond to ARC layer 204 of FIG. 4), a color filter layer 306 (which may generally correspond to color filter layer 206 of FIG. 4), and a lens structure such as microlens 308 (which, may generally correspond to microlens 208 of FIG. 4). In the illustrative example of FIG. 5 each of first and second photodiodes 301 and 302 may function in the same general manner as described in connection with photodiode 202 of FIG. 4. For example, light such as light 50 may be received at direction sensing pixel 300 through microlens 308. Microlens 308 may be configured to direct light 50 towards one of the first photodiode 301 or second photodiode 302 depending on the angle at which light 50 is incident upon microlens 308. For example, microlens 308 may be configured to direct light 50 towards first photodiode 301 when light 50 is received at pixel 300 from a first direction, and may be configured to direct light 50 towards second photodiode 302 when light 50 is received at pixel 300 from a second direction. This, however, is merely illustrative. Microlens 308 may be configured to direct light such as light 50 that is received at a direction sensing pixel 300 in any suitable direction.

Light 50 that is received at direction sensing pixel 300 may pass through a color filter such as color filter 306 (sometimes referred to herein as color filter layer 306 or color filter element 306) that allows only light of a certain wavelength (for example, light having a wavelength that corresponds to a certain color or an infrared or ultraviolet wavelength) to pass. In one illustrative embodiment, color filter 306 may be a clear color filter element that allows light of all wavelengths to pass. Light 50 may also pass through ARC layer 304 that reduces unwanted reflections caused by light, that is received at direction sensitive pixel 300.

Light 50 may be received at one of photodiode 301 and/or photodiode 302. In one illustrative example, photodiode 302 may receive more light than photodiode 301. In such an illustrative example, microlens 308 may direct light 50 such that more light 50 is incident upon photodiode 302 than photodiode 301. This, however, is merely illustrative. Microlens 308 need not direct light 50 onto one of photodiode 301 and 302 in order for more light to be received at one of photodiode 301 or 302. For example, one of photodiode 301 or 302 may receive more light due to the directionality of the light 50 that is received at image sensor 16 and pixel array 18 regardless of microlens 308.

When one of photodiodes 301 and 302 receives more light than the other (for example, when photodiode 302 receives more light than photodiode 301), the photodiode that receives more light may generate a stronger electrical signal than the photodiode that receives less light. Because the amount of light received by each of photodiodes 301 and 302 may be dependent upon the direction of travel of the light 50 at the time that it is received at the pixel, the electrical signal generated by photodiodes 301 and 302 may be indicative of the direction of travel of light 50. In one illustrative embodiment, photodiode 301 may generate a greater electrical signal than photodiode 302 when light 50 is received at direction sensing pixel 300 from a first direction, and photodiode 302 may generate a greater signal than photodiode 301 when light 50 is received at direction sensing pixel 300 from a second direction. In this way, the electrical signals generated by photodiodes 301 and 302 may be indicative of the direction of travel of light 50 that is received at direction sensing pixel 300. Direction sensing pixel 300 may therefore be configured to sense the directionality of light 50 that is incident upon pixel array 18.

The examples described above relating to a direction sensing pixel 300 in connection with FIG. 5 are merely illustrative. For example, direction sensing pixel 300 may have any suitable configuration and/or arrangement of components for detecting the direction of light 50 that is received upon direction sensing pixel 300 and may be configured to detect the direction of light 50 received at direction sensing pixel 300 by any suitable means. In one illustrative embodiment (such as the illustrative embodiment described in connection with FIG. 5), direction sensing pixel 300 may be provided with two separate photosensitive elements (for example photodiodes 301 and 302) arranged in a one by two configuration. This, however, is merely illustrative. In one illustrative example, direction sensing pixel 300 may be provided with a two by two configuration of photodiodes. In such a configuration, direction sensing pixel 300 may detect light that is received upon direction sensing pixel 300 from one or more directions (e.g., any direction) using the electrical signals generated by the individual photosensitive elements. In some scenarios, direction sensing pixel 300 may be provided with any suitable number of photosensitive elements such as photodiodes 301 and 302 arranged in any suitable configuration for determining the direction of travel of light such as light 50 that is received upon direction sensing pixel 300.

In one illustrative example, direction sensing pixel 300 may be provided with a lens such as microlens 308 that is formed in an offset configuration on direction sensing pixel 300. For example, microlens 308 may be formed such that each of the photosensitive elements of direction sensing pixel 300 (for example, photodiodes 301 and 302) are not covered evenly by microlens 308. In such a configuration, light that is received at direction sensing pixel 300 may pass through microlens 308, which may direct the light 50 towards one of the photodiodes 301 or 302 depending on the orientation (e.g., the offset configuration) of microlens 308 over photodiodes 301 and 302. Light that is received at direction sensing pixel 300 from a first direction may therefore be directed onto one of the photosensitive elements of direction sensing pixel 300, while light received from another direction may be directed onto another photosensitive element of direction sensing pixel 300. The electrical signals generated by each of the photosensitive elements of direction sensing pixel 300 may therefore be indicative of the amount of the light received thereon, which may indicate the direction of travel of the light that is received at direction sensing pixel 300. In this way, direction sensing pixel 300 may be configured to detect the direction of light such as light 50 using offset lens structures such as an offset microlens 308 that directs light onto a photosensitive element of direction sensing pixel 300 based on the direction of travel of light 50 when it is received at direction sensing pixel 300.

In one illustrative example, direction sensing pixel 300 may further include an opaque layer such as opaque layer 310. Opaque layer 310 may be any suitable opaque material that may be configured to block light such as light 50 that is received at direction sensing pixel 300. In one illustrative example, opaque layer 310 may include a metal portion such as a metal shielding layer. This, however, is merely illustrative. Opaque layer 310 may be formed of metal, plastic, ceramic, or any other suitable material, or may be formed of a thin layer such as an opaque ink, film, or other layer that may be deposited on a surface of a component of direction sensing pixel 300. In the illustrative example of FIG. 5, opaque layer 310 is provided over second photodiode 302 and is configured to block light (such as light 50) that would otherwise reach photodiode 302. In this way, opaque layer 310 may block light such as light 50 that is traveling in a given direction when it is received at direction sensing pixel 300. In such an illustrative example, opaque layer 310 may be configured such that only light travelling in a certain direction may be received upon a photosensitive element (such as photodiode 301) of direction sensing pixel 300. In such a scenario, direction sensing pixel 300 may be configured to only generate an electrical signal (e.g., one of photodiodes 301 and 302 may only receive light such as light 50 and generate an electrical signal in response) when light 50 is traveling in a given direction such that opaque layer 310 does not block the light 50. In this way, direction sensing pixel 300 may be configured to only be sensitive to light that is traveling in a certain direction or to be sensitive to all light except for light that is traveling in a certain direction) using an opaque layer 310, allowing direction sensing pixel 300 to detect the direction of light that is received upon a direction sensing pixel 300.

In the illustrative example described in connection with FIG. 5 above, opaque layer 310 is provided over photodiode 302 (e.g., between ARC layer 304 and photodiode 302). This however, is merely illustrative. Opaque layer 310 may be provided on either one of photodiode 301 or 302 (or on top of one or any combination of photodiodes provided in a pixel such as direction sensing pixel 300) in any suitable configuration. For example, opaque layer 310 may be provided between color filter element 306 and ARC layer 304. In one illustrative example, ARC layer 304 may be omitted (over multiple or one of photosensitive elements such as photodiodes 301 and/or 302). Opaque layer 310 may be formed in place of ARC layer 304 (for example, opaque layer 310 may be formed between color filter layer 306 and photodiode 302 where ARC layer 304 is shown over photodiode 302 in FIG. 5), or may be formed between color filter layer 306 and ARC layer 304 when ARC layer 304 is left in place.

In the illustrative embodiment described in connection with FIG. 5, two separate photosensitive elements such as photodiodes 301 and 302 are provided, and all or one part of one of the photodiodes 301 and/or 302 are covered by opaque layer 310 such that light 50 is not received upon the covered photodiode. This, however, is merely illustrative. A direction sensing pixel 300 may include one photodiode or two photodiodes, more than two photodiodes (for example, four photodiodes) or any other suitable number of photodiodes or other photosensitive elements. In one illustrative example, direction sensing pixel 300 may include two photosensitive elements that are each half the size of an ordinary photosensitive element, allowing an entire direction sensing pixel 300 to be formed with the same size as a single pixel (such as image sensing pixel 200). In one illustrative embodiment, direction sensing pixel 300 may include only one photosensitive element that receives light such as light 50. In such an illustrative embodiment, an opaque layer 310 may be formed over a portion of the photosensitive element (such as a photodiode 302) such that the photosensitive element detects light that is received at direction sensing pixel 300 from one direction, but does not receive light that is received at direction sensing pixel 300 from a different direction. In this way, direction sensing pixel 300 may be configured to determine the direction of the light such as light 50 that is received at a photosensitive element such as photodiode 302 based on the electrical signal that is generated by photodiode 302 in response to the light that is received thereon.

Figure 6:
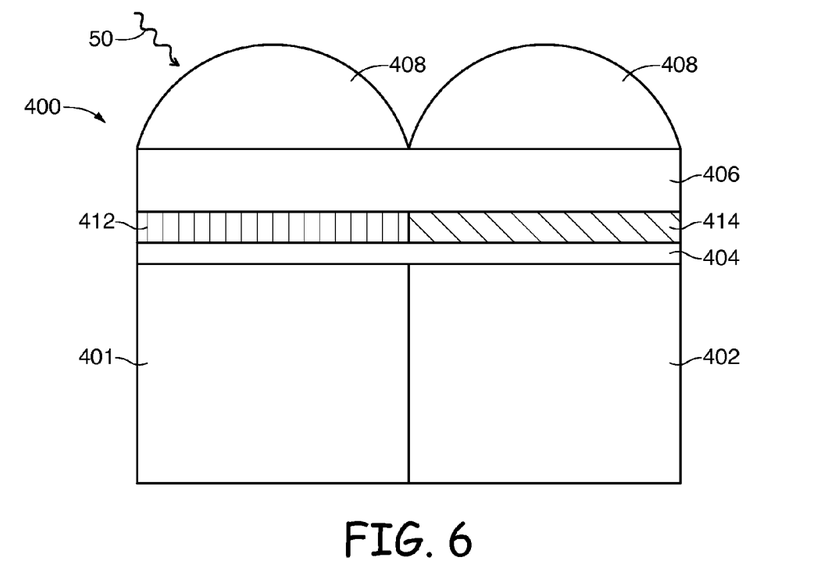
FIG. 6 is a cross-sectional view of an illustrative polarization sensitive pixel in accordance with an embodiment of the present invention.

A cross-sectional view of an illustrative polarization sensing pixel 400 (sometimes referred to herein as pixel 400, polarization sensitive pixel 400, or polarization pixel 400) that may be formed in a pixel block 100 (in, for example, pixel array 18) is shown in FIG. 6. In the illustrative example of FIG. 6, polarization sensing pixel 400 may be provided with a first photodiode 401 (sometimes referred to herein as photodiode 401), a second photodiode 402 (sometimes referred to herein as photodiode 402), an ARC layer 404 (which may generally correspond to ARC layer 204 of FIG. 4), a color filter layer 406 (which may generally correspond to color filter layer 206 of FIG. 4), and one or more lens structures such as microlenses 408 (which may generally correspond to microlens 208 of FIG. 4). In the illustrative example of FIG. 6, each of first and second photodiodes 401 and 402 may function in the same general manner as described in connection with photodiode 202 of FIG. 4. For example, light such as light 50 may be received at polarization sensing pixel 400 through microlenses 408. Microlenses 408 may be configured to direct light 50 towards one of first photodiode 401 or second photodiode 402. For example, a first one of microlenses 408 may be configured to direct light 50 towards first photodiode 401, and a second one of microlenses 408 may be configured to direct light 50 towards second photodiode 402. This, however, is merely illustrative. Polarization sensing pixel 400 may be provided with any suitable number of microlenses 408 configured to direct light onto any suitable number of photosensitive elements such as photodiodes 401 and 402. In one illustrative embodiment, polarization sensitive pixel 400 may be provided with a single lens structure (such as a single microlens 408, for example) that is configured to direct light onto the photodiodes such as photodiodes 401 and 402 of polarization sensitive pixel 400. A single microlens 408 may be formed over all or part of one or both photodiodes 401 and/or 402.

Light 50 may pass through ARC layer 404 that reduces unwanted reflections caused by light that is received at polarization sensing pixel 400. Light 50 that is received at photodiodes 401 and/or 402 may pass through to color filter such as color filter 406 (sometimes referred to herein as color filter element 406 or color filter layer 406) that allows only light of a certain wavelength (for example, light having a wavelength that corresponds to a certain color or an infrared or ultraviolet wavelength to pass). In one illustrative embodiment, color filter 406 may be a clear color filter element that allows light of all wavelengths to pass. In the illustrative example of FIG. 6, one color filter element 406 is provided. This, however, is merely illustrative. Polarization sensing pixel 400 may be provided with any suitable number of color filter elements 406. For example, polarization sensing pixel 400 may be provided with multiple different color filter elements 406 arranged in a stacked configuration. Polarization sensing pixel 400 may be provided with a different color filter element over each photosensitive element (such as photodiodes 401 and 402) that form polarization sensing pixel 400. For example, polarization pixel 400 may be provided with a color filter element 406 that only allows light having, a blue wavelength to pass over photodiode 401, and may be provided with a color filter element 406 that only allows green light to pass over photodiode 402. This, however, is merely illustrative. Polarization sensing pixel 400 may be provided with any suitable number and arrangement of color filter elements 406 over any suitable combination of photosensitive elements.

Polarization sensing pixel 400 may be provided with polarization filters such as polarization filters 412 and 414. Polarization filters 412 and 414 may be configured to allow only light having a certain polarization state to pass. For example, polarization filter 412 may be configured to allow only light having a first polarization state (for example, light having a linear, circular, elliptical, vertical, horizontal, clockwise, or counterclockwise polarization state) to pass, while polarization filter 414 may be configured to allow only light having a second polarization state (for example, light having a linear, circular, elliptical, vertical, horizontal, clockwise, or counterclockwise polarization state). In one illustrative embodiment, polarization filters 412 and 414 may include a metal grating (such as a patterned metal grating, for example) that only allows light having a certain polarization state to pass. Polarization filters 412 and 414 may include dielectric films having birefringent properties. In such an illustrative example, the polarization state of light such as light 50 that is incident upon polarization sensing pixel 400 may change based on the wavelength of the light 50 that is received at polarization sensing pixel 400. This, however, is merely illustrative. Polarization filters 412 and 414 may include any suitable structures, patterns, materials, orientations, or components that configure polarization filters 412 and 414 to only allow light having a certain polarization state to pass or to alter the polarization state of light such as light 50 that is received at polarization sensing pixel 400. In this way, light having a certain polarization state may be received at photosensitive elements such as photodiodes 401 and 402.

In the illustrative example of FIG. 6, only light having at first polarization state may pass through polarization filter 412 to be received at photodiode 401, and only light having a second polarization state (for example, a second polarization state that is different from the first polarization state) may pass through polarization filter 414 to be received at photodiode 402. In such an illustrative scenario, photodiode 401 may generate a first electrical signal indicative of the intensity of the light having the first polarization state that was received thereon, and photodiode 402 may generate a second electrical signal indicative of the intensity of the light having the second polarization state that was received thereon. In this way, photodiodes 401 and 402 may generate two different electrical signals indicative of the intensities of light having two different polarization states received upon polarization sensing pixel 400, such that polarization sensing pixel 400 may be configured to detect a polarization state of the light that is received at pixel array 18.

In the illustrative example of FIG. 6, polarization titters 412 and 414 are formed between ARC layer 404 and color filter element 406. This, however, is merely illustrative. For example, polarization filters 412 and 414 may be formed between microlenses 408 and color filter layer 406, or may be formed between photodiodes 401 and 402 and ARC layer 404. In one illustrative embodiment, color filter 406 and/or ARC layer 404 may be omitted from polarization sensing pixel 400.

Figure 7:
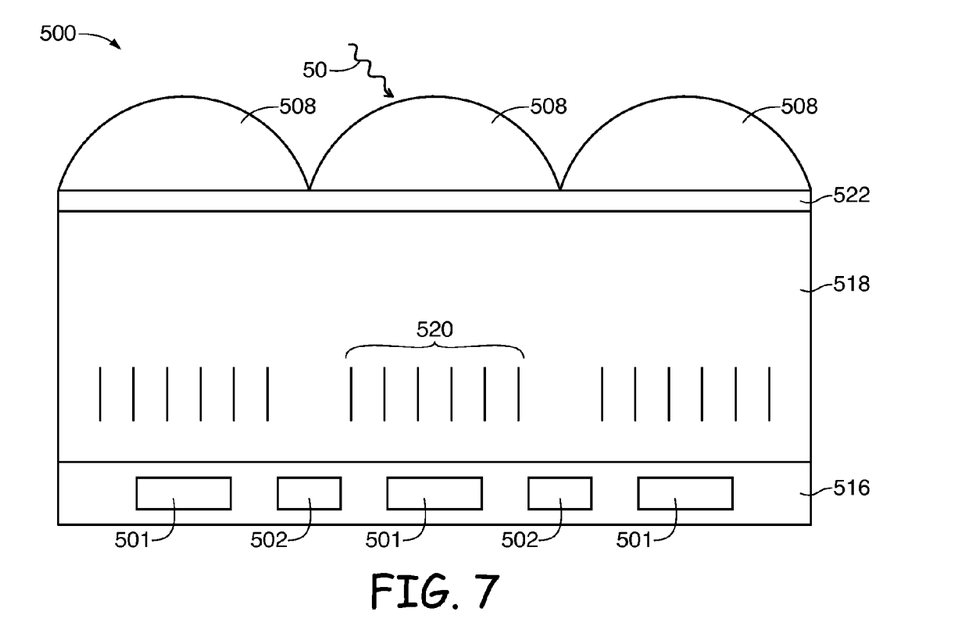
FIG. 7 is a cross-sectional view of an illustrative diffractive wavelength separation pixel in accordance with an embodiment of the present invention.

A cross-sectional view of an illustrative diffractive wavelength separation pixel 500 that may be formed in a pixel block 100 (in, for example, pixel array 18) is shown in FIG. 7. An example of a pixel such as diffractive wavelength separation pixel 500 can be found in Yang et al. (U.S. Pat. No. 7,808,023), which is hereby incorporated by reference herein in its entirety. In the illustrative example of FIG. 7, a portion of a pixel array (such as pixel array 18, for example) including a diffractive wavelength separation pixel 500 is shown. Diffractive wavelength separation pixel 500 may be formed on a substrate such as substrate 516, which may include any suitable semiconductor-based structure (such as, for example, silicon-on-insulator, doped and undoped semiconductors, epitaxial silicon layers supported by a semiconductor base, or other semiconductor structures). Photosensitive elements such as photodiodes 501 and 502 may be formed on substrate 516. In the illustrative embodiment of FIG. 7, photodiodes 501 and 502 may both receive light such as light 50 that is incident upon diffractive wavelength separation pixel 500. Photodiodes 501 may be configured to receive light of a first wavelength (e.g., light having a long wavelength) and photodiodes 502 may be configured to receive light having a second wavelength (e.g., light having a short wavelength). Photodiodes 501 and 502 may function in the same general manner as described in connection with photodiode 202 of FIG. 4. A light transmissive protective layer 518 (sometimes referred to herein as transmissive protective layer 518, transmissive layer 518 or protective layer 518) may be formed on substrate 516 of diffractive wavelength separation pixel 500. Light transmissive protective layer 518 may be formed over photodiodes 501 and 502 that may be formed on an upper surface of substrate 516. Light transmissive protective layer 518 may include at least one grating such as grating 520 (sometimes referred to herein as diffraction grating 520), which may be formed over photodiode 501 and/or photodiode 502. Grating's such as grating 520 may be formed of light transmissive material. In one illustrative embodiment, light transmissive protective layer 518 and diffraction gratings 520 formed therein are each formed of transparent materials having different indices of refraction. For example, gratings 520 may be formed of a material having a first index of refraction, and light transmissive protective layer 518 may be formed of a different material having a second, different index of refraction than that of gratings 520. In the illustrative example of FIG. 7, the gratings 520 are evenly spaced. This, however, is merely illustrative. Gratings 520 may be formed in any suitable arrangement or configuration, and may be arranged having even or uneven spacing. Gratings 520 may be sub-wavelength gratings that separate light such as light 50 that is incident upon diffractive wavelength separation pixel 500 into different components based on the wavelengths of the components of light 50. Diffractive wavelength separation pixel 500 may include a spacing layer 522 interposed between transmissive protective layer 518 and lenses such as microlenses 508. Multiple lenses such as microlenses 508 (which may generally correspond to microlenses 208 as described in connection with FIG. 2, for example) that direct light onto diffractive wavelength separation pixel 500 may be formed on spacing layer 522 and may be formed over gratings 520 and photodiodes 501 and/or 502.

An illustrative diffractive wavelength separation pixel 500 as shown in FIG. 7 may redirect light such as light 50. For example, light 50 may pass through microlens 508, which may direct or focus light 50 onto diffractive wavelength separation pixel 500. Microlens 508 may be configured to collimate light 50 such that light exiting microlens 508 is traveling in a direction that is substantially perpendicular to diffractive wavelength separation pixel 500 (for example, light 50 that exits microlens 508 may be in travelling perpendicular to transmissive protective layer 518 in the plane of the page of FIG. 7). Light 50 may pass through spacing layer 522 and enter transmissive protective layer 518. Light 50 may travel through transmissive protective layer 518 to grating 520.

Light 50 that is incident upon grating 520 may be diffracted. For example, a component of light 50 that has a wavelength greater than the grating period of grating 520 may be diffracted into the $0^{th}$ diffractive order and pass through the grating 520. The component of light 50 having a wavelength greater than the grating period of grating 520 may be received at the photodiode 501 directly below grating 520. A component of light 50 that has a wavelength less than the grating period of grating 520 may be diffracted into higher diffractive orders. This light having a wavelength that is less than the grating period of grating 520 may be therefore be diffracted as it passes through grating 520 and may be directed such that it is received at least one of the photodiodes 501 on either side of photodiode 502.

Because diffractive wavelength separation pixel 500 does not absorb or reflect light having certain wavelengths while transmitting tight having other wavelengths (in the manner of color filters such as color filter elements 206, for example), all of light that is incident upon diffractive wavelength separation pixel 500 may be received at a photosensitive element such as photodiodes 501 and 502 while still providing wavelength-dependent separation and detection. For example, diffractive wavelength separation pixel 500 may separate light such as light 50 into a long wavelength component (e.g., red light) and a short wavelength component (e.g., blue light). Light 50 may pass through gratings 520, and the long wavelength component of light 50 (e.g., red light) may be transmitted to the photodiode 501 directly below grating 520, while short wavelength component of light 50 (e.g., blue light) may be diffracted and transmitted to one or both of photodiodes 501 on either side of photodiode 502. Each of photodiodes 501 and 502 may generate an electrical signal in response to the light received thereon, and in this way, may be able to detect both the wavelength and intensity of the light 50 that is received at diffractive wavelength separation pixel 500 without blocking all light except for light of a certain wavelength. In one illustrative example, the electrical signals generated by photodiodes 501 and 502 of diffractive wavelength separation pixel 500 may be representative of a differential wavelength component distribution of the light 50. In such an example, diffractive wavelength separation pixel 500 may provide information relating to the relative distributions of different wavelength components of light received at diffractive wavelength separation pixel 500.

Pixel array 18 of image sensor 16 may include pixel blocks 100 including image sensing pixels 200, direction sensing pixels 300, polarization sensing pixels 400, and/or diffractive wavelength separation pixels 500 arranged in various configurations and orientations in order to provide information relating to the light such as light 50 that is received upon pixel array 18. For example, pixel blocks 100 may be formed with various combinations of image sensing pixels 200, direction sensing pixels 300, polarization sensing pixels 400, and/or diffractive wavelength separation pixels 500 to capture data relating to the wavelength, intensity, direction, polarization, amount, wavelength component distribution, and other characteristics of light that may be received at pixel array 18. As described in connection with FIG. 2, pixel blocks 100 may be arranged in various patterns in order to form a pixel array that is capable of detecting information relating to the various characteristics of light 50 that is received by image sensor 16. In a pixel array 18 having multiple different pixel types formed in pixel blocks 100 that are formed in repeating patterns in pixel array 18, information relating to the different characteristics of light that is received by the image sensor may be gathered in a spatially correlated manner. For example, a pixel array 18 including pixel blocks 100 formed of image sensing pixels 200 and polarization sensing pixels 400 may be able to detect wavelength, intensity, and polarization information relating to light that is incident upon a portion of pixel array 18 (e.g., light that is incident upon a pixel block 100) by directly measuring the characteristics of the light incident upon that portion of the array 18 using the different pixel types. This may provide advantages over multiple array systems that can detect various types of information relating to the light that is received thereon, but that require spatial alignment and processing to correlate the data obtained for different characteristics using different arrays.

Figure 8:
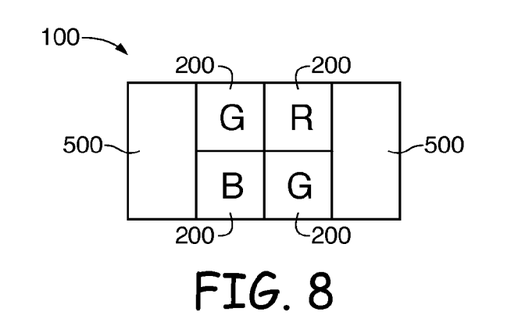
FIG. 8 is a diagram of an illustrative pixel block such as the pixel block shown in FIG. 1 that may include image sensor pixels arranged in a Bayer pattern and diffractive wavelength separation pixels in accordance with an embodiment of the present invention.

A diagram of an illustrative pixel block 100 such as a pixel block that may be included in pixel array 18 of image sensor 16 is provided in FIG. 8. In the illustrative pixel block 100 of FIG. 8, a pixel block 100 is provided with four image sensing pixels 200 arranged in a Bayer mosaic pattern, and two diffractive wavelength separation pixels 500 arranged on either side of the four image sensor pixels 200. Such a pixel block 100 may allow for the detection of the wavelength and frequency of light such as light 50 that may be incident upon pixel array 18 with increased sensitivity. The arrangement of image sensing pixels 200 and diffractive wavelength separation pixels 500 in pixel block 100 shown in FIG. 8 is merely illustrative. Image sensing pixels 200 and diffractive wavelength separation pixels 500 may be combined in any suitable combination and arrangement to form a pixel block 100 for capturing light 50 incident upon a pixel array 18.

Figure 9A:
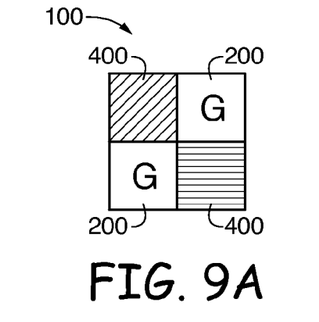
FIGS. 9A and 9B are diagrams of illustrative pixel blocks such as the pixel block shown in FIG. 1 that may include image sensor pixels and polarization sensitive pixels arranged in accordance with an embodiment of the present invention.
Figure 9B:
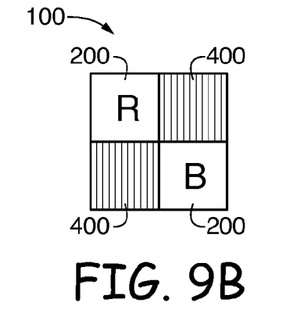

FIGS. 9A and 9B show diagrams of illustrative pixel blocks 100 such as the type that may be included in pixel array 18 of image sensor 16. In the illustrative examples of FIGS. 9A and 9B, pixel blocks 100 are formed with image sensing pixels 200 and polarization sensing pixels 400. In the example of FIG. 9A, two image sensing pixels 200 (configured to detect green light, for example) are formed in an alternating pattern with two polarization sensing pixels 400. Polarization sensing pixels 400 may be configured to detect light having different polarization states. For example one polarization sensitive pixel 400 of FIG. 9A may be configured to detect light having a linear polarization state, while the other polarization sensitive pixel 400 may be configured to detect light having an elliptical polarization state. Polarization sensitive pixels 400 may be provided with color filter elements such as color filters 406. In such an illustrative example, a pixel block 100 such as the pixel block 100 in FIG. 9A may include four pixels (such as, for example, two image sensing pixels 200 and two polarization sensing pixels 400) arranged in a Bayer mosaic pattern. Such an arrangement may provide a pixel block 100 that is capable of capturing information such as wavelength and intensity information, as well as polarization information, of light 50 that is received at pixel array 18.

The illustrative example of FIG. 9B shows a pixel block 100 having two image sensing pixels 200 and two polarization sensing pixels 400 arranged in an alternating pattern. Both polarization sensing pixels 400 may be configured to detect light having the same polarization state (for example, light having a circular polarization state), while image sensing pixels 200 may be configured to detect the intensity of light having certain wavelengths (such as red light and/or blue light, for example). In the illustrative example of FIG. 9B, polarization sensitive pixels 400 may not be provided with any color filter elements 406. In such an illustrative example, polarization sensitive pixels may detect light of any wavelength, but may only detect light having a certain polarization state.

The examples of pixel blocks 100 including image sensing pixels 200 and polarization sensing pixels 400 shown in FIGS. 9A and 9B are merely illustrative. For example, any combination of image sensing pixels 200 configured to detect light having any wavelength and intensity may be arranged in any suitable pattern or configuration with polarization sensing pixels 400 configured to detect light having any polarization state. Polarization sensing pixels may be provided with color filter elements 406 in any suitable arrangement to detect light having a certain wavelength, or may be provided with no color filter elements.

Figure 10:
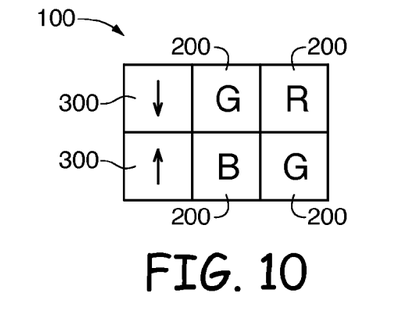
FIG. 10 is a diagram of an illustrative pixel block such as the pixel block shown in FIG. 1 that may include direction sensitive pixels and image sensor pixels arranged in a Bayer pattern in accordance with an embodiment of the present invention.

A diagram of an illustrative pixel block 100 such as the type that may be included in pixel array 18 of image sensor 16 is provided in FIG. 10. In the illustrative pixel block 100 of FIG. 10, a pixel block 100 is provided with four image sensing pixels 200 arranged in a Bayer mosaic pattern, and two direction sensing pixels 300 arranged on a side of the four image sensor pixels 200. Such a pixel block 100 may allow for the wavelength and intensity of light that is incident upon pixel block 100 to be detected, while also detecting the direction of the light that is received at pixel block 100. For example, each of direction sensing pixels 300 may be configured to detect light that is travelling in a given direction when it is received at pixel array 18. In the illustrative example of FIG. 10, each direction sensing pixel 300 is configured to detect light that is travelling in a different direction. This, however, is merely illustrative. Multiple direction sensing pixels 300 configured to detect light travelling in the same direction or in different directions may be arranged in alternating patterns with image sensor pixels 200 (or with polarization sensing pixels 400, and/or diffractive wavelength separation pixels 500) in order to detect the direction flight (and any other suitable characteristics of light 50) received at a pixel block 100. Direction sensing pixels 300 may also be provided with color filter elements 306 that allow direction sensing pixels 300 to detect light of a certain wavelength. In such an illustrative embodiment, direction sensing pixels 300 having color filter elements 306 may be arranged with image sensor pixels 200 in a Bayer mosaic pattern to detect both the direction and wavelength/intensity of light that is received at a pixel block 100. This, however, is merely illustrative. Any number of direction sensing pixels 300 may be provided in any suitable configuration to detect light that is traveling in any suitable direction when it is received at pixel block 100.

Figure 11:
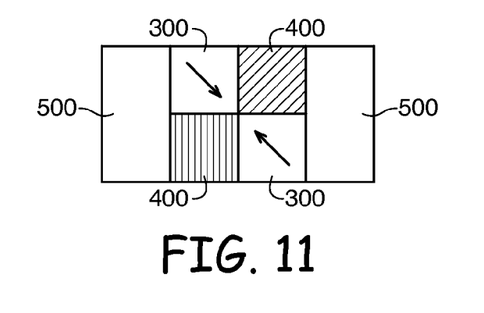
FIG. 11 is a diagram of an illustrative pixel block such as the pixel block shown in FIG. 1 that may include diffractive wavelength separation pixels, direction sensitive pixels, and polarization sensitive pixels in accordance with an embodiment of the present invention.

A diagram of an illustrative pixel block 100 such as the type that may be included in pixel array 18 of image sensor 16 is provided in FIG. 11. In the illustrative pixel block 100 of FIG. 11, a pixel block 100 is provided with two direction sensing pixels 300 and two polarization sensing pixels 400 arranged in an alternating pattern, and two diffractive wavelength separation pixels 500 arranged on either side of the direction sensing pixels 300 and the polarization sensing pixels 400. In such an illustrative example, pixel block 100 may include only direction sensing pixels 300, polarization sensing pixels 400, and/or diffractive wavelength separation pixels 500 (i.e., pixel block 100 may not include any image sensing pixels 200). In the illustrative example of FIG. 11, pixel block 100 may be capable of detecting wavelength and intensity information regarding light 50 using diffractive wavelength separation pixels 500, may be able to detect direction information regarding light 50 using direction sensing pixels 300, and may be able to detect polarization information regarding light 50 using polarization sensing pixels 400. In the illustrative example of FIG. 11, each of the direction sensing pixels 300 may be configured to detect light traveling in a different direction, and each polarization sensing pixel 400 may be configured to detect light having a different polarization state. Such an arrangement may provide robust information relating the light that is received at pixel block 100. This, however, is merely illustrative. Direction sensing pixels 300 may be configured to detect light having the same direction or a different direction, and polarization sensing pixels 400 may be configured to detect light having a same or different polarization state. Direction sensing pixels 300 and polarization sensing pixels 400 may be provided with color filters (for example, color filters arranged in a Bayer mosaic pattern) which may provide information relating to the wavelength and intensity of the light received thereon. In general, any suitable combination of image sensing pixels 200, direction sensing pixels 300, polarization sensing pixels 400, and diffractive wavelength separation pixels 500 may be provided in a pixel block 100.

Figure 12:
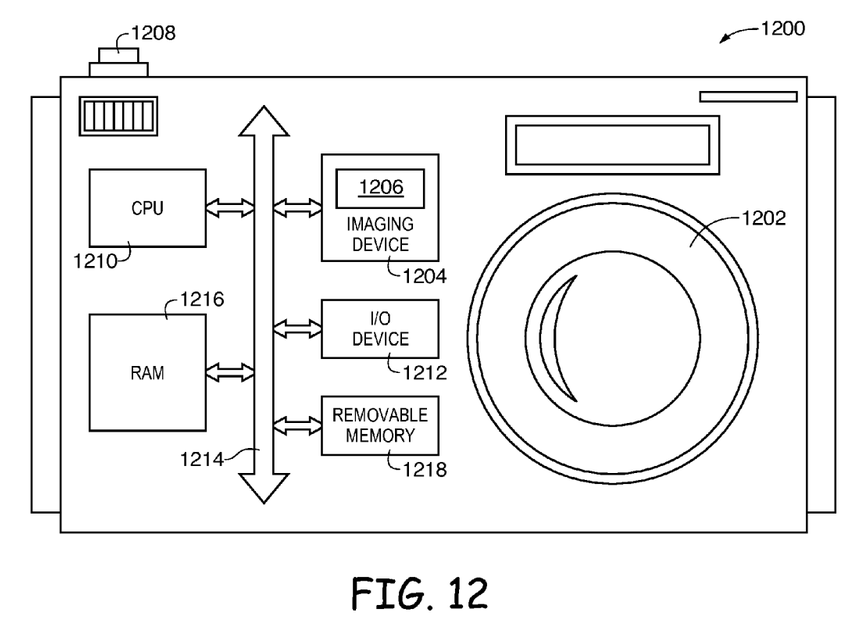
FIG. 12 is a block diagram of a processor system that may employ an electronic device having a pixel array including the pixels and pixel blocks of FIGS. 1-11 in accordance with embodiments of the present invention.

FIG. 12 shows in simplified form a typical processor system 1200 (sometimes referred to herein as system 1200), such as a digital camera, which includes an imaging device such as imaging device 1204 (e.g., an imaging system that may include pixel blocks such as pixel blocks 100 having multiple different pixel types such as image sensing pixels 200, direction sensing pixels 300, polarization sensing pixels 400, and diffractive wavelength separation pixels 500). Imaging device 1204 may further include a pixel array 1206, which may include pixel arrays 18. Processor system 1200 is exemplary of a system having digital circuits that could include imaging device 1204. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 1200, which may be a digital still or video camera system, may include a lens such as lens 1202 (which may include a lens such as lens 14 of camera module 12) for focusing an image onto a pixel array such as pixel array 1206 (which may include a pixel array 18) when shutter release button 1208 is pressed. Processor system 1200 may include a central processing unit such as central processing unit (CPU) 1210. CPU 1210 may be a microprocessor that controls camera functions and one or more image flow functions and communicates with one or more input/output (I/O) devices 1212 (such as, for example, input/output devices 28) over a bus such as bus 1214. Imaging device 1204 may also communicate with CPU 1210 over bus 1214. System 1200 may include random access memory (RAM) 1216 and removable memory 1218. Removable memory 1218 may include flash memory that communicates with CPU 1210 over bus 1214. Imaging device 1204 may be combined with CPU 1210, with or without memory storage, on a single integrated circuit or on a different chip. Although bus 1214 is illustrated as a single bus, it may be one or more buses or bridges or other communication paths used to interconnect the system components.

A pixel cluster may include a plurality of adjacent pixels of different types that receive light. The pixel cluster may include a polarization sensing pixel that detects a polarization state of the light received at the pixel cluster and that generates an electrical signal indicative of the polarization state, as well as an additional pixel that detects an additional characteristic of the light received at the pixel cluster and that generates an additional electrical signal indicative of the additional characteristic. The additional characteristic may be different than the polarization state.

If desired, the polarization sensing pixel may include a first polarization filter that selectively transmits light having a first polarization state that is received at the pixel cluster and a first photodiode that receives the light having the first polarization state that is transmitted by the first polarization filter. The first polarization filter may be formed over the first photodiode. The polarization sensing pixel may include a second polarization filter that selectively transmits light having a second polarization state that is received at the pixel cluster and a second photodiode that receives the light having the second polarization state that is transmitted by the second polarization filter. The second polarization filter may be formed over the second photodiode and the first polarization state may be different than the second polarization state. The electrical signal generated by the polarization sensing pixel may include a first electrical signal generated by the first photodiode in response to receiving the light having the first polarization state and a second electrical signal generated by the second photodiode in response to receiving the light having the second polarization state.

If desired the additional pixel may include a direction sensing pixel and the additional characteristic may include a direction of the light received at the pixel cluster. The direction sensing pixel may include a first photodiode that receives the light traveling in a first direction that is received at the pixel cluster, a second photodiode that receives the light traveling in a second direction that is received at the pixel cluster, and at least one microlens that directs light onto at least one of the first and second photodiodes. The additional electrical signal may be generated by the direction sensing pixel and may include a first electrical signal generated by the first photodiode in response to receiving the light traveling in the first direction, and a second electrical signal generated by the second photodiode in response to receiving the light traveling in the second direction. An opaque layer that blocks the light traveling in the first and/or second direction from reaching the first and/or second photodiode may be formed over the first and/or second photodiode.

If desired, the additional pixel may include a diffractive wavelength separation pixel, and the additional characteristic may include a long wavelength component and a short wavelength component of the light that is received at the pixel cluster. The diffractive wavelength separation pixel may include a first photodiode configured to receive the light of the long wavelength component, a second photodiode configured to receive the light of the short wavelength component, at least one diffractive structure that directs the light of the long wavelength component onto the first photodiode and that directs the light of the short wavelength component onto the second photodiode, and a microlens that focuses light onto the diffractive structure. The additional electrical signal may be generated by the diffractive wavelength separation pixel and may include a first electrical signal generated by the first photodiode in response to the light of the long wavelength component received by the first photodiode, and a second electrical signal generated by the second photodiode in response to the light of the short wavelength component received by the second photodiode.

If desired, the additional pixel may include an image sensing pixel, and the additional characteristic may be an intensity of the light. The image sensing pixel may include a microlens that directs the light onto the image sensing pixel, a color filter element that transmits the light of a given wavelength, and a photodiode that generates the additional electrical signal in response to the light of the given wavelength that is received at the pixel cluster.

A pixel block may include different pixel types that measure different properties of light received at the pixel block. The pixel block may include a diffractive wavelength separation pixel that diffracts the light received at the pixel block into a long wavelength component and a short wavelength component and that generates first and second respective electrical signals in response to receiving the long wavelength component and the short wavelength component. The pixel block may include an additional pixel that generates an additional electrical signal indicating a property of the light that is different than the long wavelength component and the short wavelength component.

If desired, the additional pixel may include a direction sensing pixel, and the property may include a direction of the light received at the pixel block If desired, the additional pixel may include an image sensing pixel, and the property may include an intensity of the light.

A pixel array that detects multiple properties of light received at the pixel array may include a plurality of pixel units that include a plurality of different pixel types. The pixel array may include a first pixel type in the plurality of pixel units that detects a first property of the light received at the pixel array. The first property of the light is may be a selected one of a polarization state and a wavelength component contribution. The pixel array may include a second pixel type in the plurality of pixel units that detects a second property of the light received at the pixel array. The second property may be a selected one of the polarization state, the wavelength component contribution, a directionality, and an intensity. The first and second properties may be different.

If desired, each of the plurality of pixel units may detect the first and second properties of the light at a different location in the pixel array.

If desired, the first pixel type may generate a first electrical signal in response to detecting the first property of the light, and the second pixel type may generate a second electrical signal in response to detecting the second property of the light.

The foregoing is merely illustrative of the principles of this invention and various modifications can be made by those skilled in the art without departing from the scope and spirit of the invention. The foregoing embodiments may be implemented individually or in any combination.

What is claimed is:

1. A pixel cluster having a plurality of adjacent pixels of different types that receive light, the pixel cluster formed in an array of pixels arranged in rows and columns and the pixel cluster comprising:
    a polarization sensing pixel that detects a polarization state of the light received at the pixel cluster and that generates an electrical signal indicative of the polarization state, the polarization sensing pixel comprising a first single photodiode and a first single microlens that directs light onto the first single photodiode;
    a first additional pixel that detects a first additional characteristic of the light received at the pixel cluster and that generates a first additional electrical signal indicative of the first additional characteristic, wherein the first additional characteristic is different than the polarization state, and wherein the first additional pixel comprises a second single photodiode and a second single microlens that directs light onto the second single photodiode; and
    a second additional pixel that detects a second additional characteristic of the light received at the pixel cluster and that generates a second additional electrical signal indicative of the second additional characteristic, wherein the second additional characteristic is different than the first additional characteristic and the polarization state, wherein the second additional pixel comprises a third single photodiode and a third single microlens that directs light onto the third single photodiode, and wherein the first single photodiode, the second single photodiode, and the third single photodiode form a one-photodiode-by-three-photodiode group in a single row of the array of pixels.

2. The pixel cluster defined in claim 1, wherein the polarization sensing pixel comprises:
    a first polarization filter that selectively transmits light having a first polarization state that is received at the pixel cluster, wherein the first single photodiode receives the light having the first polarization state that is transmitted by the first polarization filter, and wherein the first polarization filter is formed over the first single photodiode;
    a second polarization filter that selectively transmits light having a second polarization state that is received at the pixel cluster; and
    a fourth single photodiode that receives the light having the second polarization state that is transmitted by the second polarization filter, wherein the second polarization filter is formed over the fourth single photodiode, and wherein the first polarization state is different than the second polarization state.

3. The pixel cluster defined in claim 2, wherein the electrical signal comprises a first electrical signal generated by the first single photodiode in response to receiving the light having the first polarization state and a second electrical signal generated by the fourth single photodiode in response to receiving the light having the second polarization state.

4. The pixel cluster defined in claim 1, wherein the first additional pixel comprises a direction sensing pixel, and wherein the additional characteristic comprises a direction of the light received at the pixel cluster.

5. The pixel cluster defined in claim 4, wherein the direction sensing pixel comprises:
    the second single photodiode, wherein the second single photodiode receives a first amount of the light traveling in at least a first direction; and
    a fourth single photodiode that receives a second amount of the light traveling in at least a second direction, wherein the second single microlens directs the light onto at least one of the second and fourth single photodiodes.

6. The pixel cluster defined in claim 5, wherein the additional electrical signal comprises a first electrical signal generated by the second single photodiode in response to receiving the first amount of the light traveling in the at least first direction, and a second electrical signal generated by the fourth single photodiode in response to receiving the second amount of the light traveling in the at least second direction.

7. The pixel cluster defined in claim 6, further comprising:
an opaque layer formed over the second single photodiode, wherein the opaque layer blocks the light traveling in the first direction from reaching the second single photodiode.

8. The pixel cluster of claim 1, wherein the first additional pixel comprises a diffractive wavelength separation pixel, and wherein the first additional characteristic comprises a long wavelength component and a short wavelength component of the light that is received at the pixel cluster.

9. The pixel cluster defined in claim 8, wherein the diffractive wavelength separation pixel comprises:
the second single photodiode, wherein the second single photodiode is configured to receive the light of the long wavelength component;
a fourth single photodiode configured to receive the light of the short wavelength component; and
at least one diffractive structure that directs the light of the long wavelength component onto the second single photodiode and that directs the light of the short wavelength component onto the fourth single photodiode, wherein the second single microlens focuses light onto the diffractive structure.

10. The pixel cluster defined in claim 9 wherein the additional electrical signal comprises a first electrical signal generated by the second single photodiode in response to the light of the long wavelength component received by the second single photodiode, and a second electrical signal generated by the fourth single photodiode in response to the light of the short wavelength component received by the fourth single photodiode.

11. The pixel cluster defined in claim 1, wherein the first additional pixel comprises an image sensing pixel, and wherein the first additional characteristic comprises an intensity of the light.

12. The pixel cluster defined in claim 11, wherein the image sensing pixel comprises:
a color filter element that transmits the light of a given wavelength, wherein the second single photodiode generates the additional electrical signal in response to the light of the given wavelength that is received at the pixel cluster.

13. A pixel block including multiple different pixel types that measure different properties of light received at the pixel block, the pixel block comprising:
a diffractive wavelength separation pixel that diffracts the light received at the pixel block into a long wavelength component and a short wavelength component and that generates first and second respective electrical signals in response to receiving the long wavelength component and the short wavelength component; and
an additional pixel that generates an additional electrical signal indicating a property of the light that is different than the long wavelength component and the short wavelength component.

14. The pixel block defined in claim 13, wherein the diffractive wavelength separation pixel comprises:
a first photodiode that generates the first electrical signal in response to receiving the long wavelength component of the light;
a second photodiode that generates the second electrical signal in response to receiving the short wavelength component of the light;
at least one diffractive structure that directs the long wavelength component of the light onto the first photodiode and that directs the short wavelength component of the light onto the second photodiode; and
a microlens that focuses light onto the diffractive structure.

15. The pixel block defined in claim 14, wherein the additional pixel comprises a direction sensing pixel, and wherein the property comprises a direction of the light received at the pixel block.

16. The pixel cluster defined in claim 15, wherein the direction sensing pixel comprises:
a first photodiode that receives a first amount of the light traveling in at least a first direction;
a second photodiode that receives a second amount of the light traveling in at least a second direction; and
at least one microlens that directs the light onto at least one of the first and second photodiodes.

17. The pixel cluster defined in claim 16, wherein the additional electrical signal comprises a first electrical signal generated by the first photodiode in response to receiving the first amount of the light traveling in the at least first direction, and a second electrical signal generated by the second photodiode in response to receiving the second amount of the light traveling in the at least second direction.

18. The pixel block defined in claim 17, further comprising:
an opaque layer formed over the first photodiode, wherein the opaque layer blocks the light traveling in the first direction from reaching the first photodiode.

19. The pixel block defined in claim 13, wherein the additional pixel comprises an image sensing pixel, and wherein the property comprises an intensity of the light.

20. The pixel block defined in claim 19 wherein the image sensing pixel comprises:
a microlens that directs the light onto the image sensing pixel;
a color filter element that transmits the light of a given wavelength; and
a photodiode that generates the electrical signal in response to the light of the given wavelength that is received at the pixel cluster.

21. A pixel array that detects multiple properties of light received at the pixel array, the pixel array comprising:
at least four adjacent two-pixel-by-two-pixel units that form a four-pixel-by-four-pixel group, each of the plurality of adjacent two-pixel-by-two-pixel units comprising at least three adjacent pixels of three different pixel types, wherein each of the plurality of adjacent two-pixel-by-two-pixel units comprises:
a first pixel type that detects a first property of the light received at the pixel array, and wherein the first property of the light is a selected one of a polarization state and a wavelength component contribution; and
a second pixel type that detects a second property of the light received at the pixel array, and wherein the second property is a selected one of the polarization state, the wavelength component contribution, a directionality, and an intensity, and wherein the first and second properties are different.

22. The pixel array defined in claim 21, wherein each of the plurality of two-pixel-by-two-pixel units detects the first and second properties of the light at a different location in the pixel array.

23. The pixel array defined in claim 21, wherein the first pixel type generates a first electrical signal in response to detecting the first property of the light, and wherein the second pixel type generates a second electrical signal in response to detecting the second property of the light.

\* \* \* \* \*